(12) United States Patent
Hagiwara et al.

(10) Patent No.: US 10,978,420 B2
(45) Date of Patent: Apr. 13, 2021

(54) SEMICONDUCTOR CHIP MOUNTING APPARATUS AND SEMICONDUCTOR CHIP MOUNTING METHOD

(71) Applicant: SHINKAWA LTD., Tokyo (JP)

(72) Inventors: Yoshihito Hagiwara, Tokyo (JP);
Tomonori Nakamura, Tokyo (JP);
Hiroshi Horibe, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/482,255

(22) PCT Filed: Jan. 30, 2018

(86) PCT No.: PCT/JP2018/003048
§ 371 (c)(1),
(2) Date: Jul. 31, 2019

(87) PCT Pub. No.: WO2018/143222
PCT Pub. Date: Aug. 9, 2018

(65) Prior Publication Data
US 2020/0251441 A1    Aug. 6, 2020

(30) Foreign Application Priority Data

Jan. 31, 2017    (JP) .............................. JP2017-016060

(51) Int. Cl.
*H01L 23/00* (2006.01)
*H01L 25/00* (2006.01)

(52) U.S. Cl.
CPC .............. *H01L 24/75* (2013.01); *H01L 24/92* (2013.01); *H01L 25/50* (2013.01);
(Continued)

(58) Field of Classification Search
CPC .......... H01L 2224/81203; H01L 24/83; H01L 24/75; H01L 24/92; H01L 2224/9211;
(Continued)

(56) References Cited

U.S. PATENT DOCUMENTS

| 6,069,024 A | 5/2000 | Murakami |
| 2011/0017397 A1* | 1/2011 | Hamazaki ............... H01L 24/90 |
| | | 156/290 |
| 2015/0050778 A1* | 2/2015 | Asahi ..................... H01L 24/83 |
| | | 438/108 |

FOREIGN PATENT DOCUMENTS

| JP | H0555277 | 3/1993 |
| JP | H08293406 | 11/1996 |

(Continued)

OTHER PUBLICATIONS

"International Search Report (Form PCT/ISA/210) of PCT/JP2018/003048," dated Mar. 20, 2018, with English translation thereof, pp. 1-3.

*Primary Examiner* — Caridad Everhart
(74) *Attorney, Agent, or Firm* — JCIPRNET

(57) ABSTRACT

The mounting apparatus includes: a bonding head 14 that bonds, while pressing, a semiconductor chip 100 onto a substrate 110 or another semiconductor chip 100; and a heating mechanism 16 that heats the semiconductor chip 100 from the side during the execution of this bonding. After two or more semiconductor chips 100 are stacked while being bonded by temporary pressure-bonding, the bonding head 14 heats and applies pressure to an upper surface of the resultant stacked body, thereby integrally pressure-bonding the two or more semiconductor chips 100, and at the time of this pressure-bonding the heating mechanism 16 heats the stacked body from the side.

20 Claims, 7 Drawing Sheets

(52) U.S. Cl.
CPC ............... *H01L 2224/7555* (2013.01); *H01L 2224/75264* (2013.01); *H01L 2224/75283* (2013.01); *H01L 2224/9211* (2013.01)

(58) Field of Classification Search
CPC ... H01L 2224/7555; H01L 2224/75283; H01L 2224/75264; H01L 25/50; H05K 1/144; H05K 3/305; H05K 3/4038
See application file for complete search history.

(56) References Cited

FOREIGN PATENT DOCUMENTS

| | | |
|---|---|---|
| JP | H11307584 | 11/1999 |
| JP | 2002110744 | 4/2002 |
| JP | 2013197146 | 9/2013 |
| JP | 2016009850 | 1/2016 |
| WO | 2010050209 | 5/2010 |

\* cited by examiner

SEMICONDUCTOR CHIP MOUNTING APPARATUS AND SEMICONDUCTOR CHIP MOUNTING METHOD

CROSS-REFERENCE TO RELATED APPLICATION

This application is a 371 application of the international PCT application serial no. PCT/JP2018/003048, filed on Jan. 30, 2018, which claims the priority benefits of Japan application no. 2017-016060, filed on Jan. 31, 2017. The entirety of the above-mentioned patent applications is hereby incorporated by reference herein and made a part of this specification.

TECHNICAL FIELD

The present application relates to a mounting apparatus and a mounting method for mounting a semiconductor chip by bonding the semiconductor chip onto a substrate or another semiconductor chip.

BACKGROUND ART

Conventionally, a mounting apparatus that mounts a semiconductor chip by bonding the semiconductor chip on an upper surface of a substrate or an upper surface of another semiconductor chip (hereinafter, collectively referred to as "mounting surface") has been widely known. An adhesive made of a thermosetting resin, or a conductive metal called a bump that is for securing electrical connection is provided on a lower surface of the semiconductor chip. The semiconductor chip is bonded onto the mounting surface by heating and hardening the adhesive or welding the bump to an electrode on the mounting surface.

For bonding the semiconductor chip, a bonding head that presses and heats the semiconductor chip from an upper surface thereof is provided in the mounting apparatus. By heating and pressing the upper surface of the semiconductor chip using the bonding head, the adhesive of the thermosetting resin is hardened, and the bump is welded to the electrode.

SUMMARY

Technical Problem

However, in the conventional mounting apparatus, a semiconductor chip is mostly heated from an upper surface thereof. In this case, according to the manner of mounting and the type of the semiconductor chip, there is a case in which temperature variations occur at the time of bonding, which in turn causes variations in mounting quality. For example, in some cases, a technique is known in which a plurality of semiconductor chips are stacked in the thickness direction and mounted as a multistage stack. In this case, by stacking, while temporarily pressure-bonding, the plurality of semiconductor chips sequentially one by one, and then heating and pressing an upper surface of the obtained stacked body, a bonding chip finally pressure-bonds the plurality of semiconductor chips collectively. At the time of final pressure-bonding, it is desired that all of the semiconductor chips be heated to an adhesive hardening temperature or above and a bump melting temperature or above. However, in the conventional mounting apparatus, because, at the time of final pressure-bonding, the upper surface of the stacked body is heated and pressed using a bonding head, the closer to the lower side of the stacked body (the lower the semiconductor chip is), the more likely the temperature is to drop. In other words, in the conventional mounting apparatus, in the case in which the multistage stack is performed, a temperature gradient occurs in a stacking direction. Such a temperature gradient leads to a difference in the degree of progress of the hardening of the adhesive and the melting of the bump, which in turn leads to a difference in mounting quality.

Also, even in the case in which only one end of a semiconductor chip is bonded, in the case in which the size thereof is relatively large, it is likely that a temperature difference occurs within the semiconductor chip. That is, in a case in which a large-sized semiconductor chip is heated and pressed from an upper surface thereof using a bonding head, it is likely that a temperature of the vicinity of the periphery of the semiconductor chip is lower than that of a central portion of the semiconductor chip. As a result, a temperature gradient occurs within a single semiconductor chip, which causes a deterioration in mounting quality.

Therefore, in the present application, a mounting apparatus capable of further improving the mounting quality of a semiconductor chip is disclosed.

Solution to Problem

A mounting apparatus disclosed in the present application includes a bonding head configured to bond, while pressing, a semiconductor chip onto a substrate or another semiconductor chip, and a heating mechanism configured to, while the bonding is performed, heat the semiconductor chip from the side.

With such a configuration, because the semiconductor chip can be heated from the side as well, variations in the temperature of the semiconductor chip to be bonded can be reduced. As a result, the mounting quality of the semiconductor chip can be further improved.

The heating mechanism may heat the semiconductor chip from the entire circumference thereof.

With such a configuration, because variations in the temperature of the semiconductor chip to be bonded can be further reduced, the mounting quality of the semiconductor chip can be further improved.

Also, by stacking, while temporarily pressure-bonding, two or more semiconductor chips and then heating and pressing an upper surface of the obtained stacked body, the bonding head may finally pressure-bond the two or more semiconductor chips collectively, and, at the time of the final pressure-bonding, the heating mechanism may heat the stacked body from the side.

With such a configuration, because temperature variations in a stacking direction which become a problem when mounting semiconductor chips as a multistage stack can be reduced, the mounting quality can be improved in the multistage stack as well.

Also, the heating mechanism may include, as a heat transfer body attached to a distal end portion of the bonding head and configured to transfer heat of the bonding head, a heat transfer body extending downward from the vicinity of the periphery of the distal end portion.

Also, the heating mechanism may include a heating body which is, by being interlocked with the bonding head or being elevated and lowered independently of the bonding head, disposed at a side of the semiconductor chip and heated by a heat source while the bonding is performed.

Also, the heating mechanism may include a hot air jetting mechanism configured to jet hot air to the side of the semiconductor chip.

Also, the heating mechanism may include a coil disposed around the semiconductor chip and configured to induction-heat the semiconductor chip as an alternating current is applied.

Also, the heating mechanism may include, at the side of the semiconductor chip, a lamp annealing mechanism configured to perform optical heating by irradiating light.

Also, in a semiconductor chip mounting method disclosed in the present application, when a semiconductor chip is pressed from an upper surface thereof by a bonding head, and the semiconductor chip is bonded onto a substrate or another semiconductor chip, the semiconductor chip is heated from the side as well by a heating mechanism.

With such a configuration, because the semiconductor chip can be heated from the side as well, variations in the temperature of the semiconductor chip to be bonded can be reduced. As a result, the mounting quality of the semiconductor chip can be further improved.

Advantageous Effects of Invention

According to the mounting apparatus and mounting method disclosed in the present application, because the semiconductor chip can be heated from the side as well, variations in the temperature of the semiconductor chip to be bonded can be reduced. As a result, the mounting quality of the semiconductor chip can be further improved.

DESCRIPTION OF THE EMBODIMENTS

Figure 1:
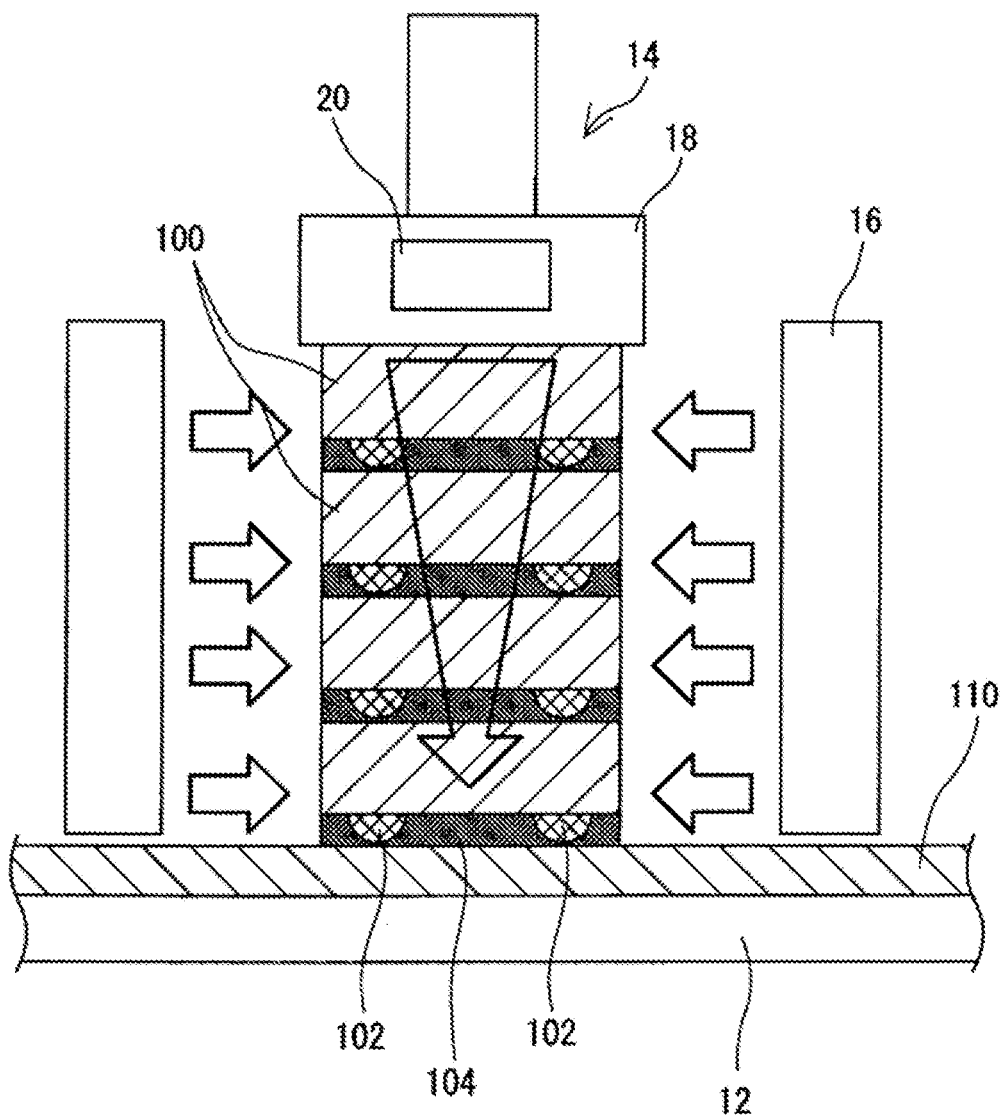
FIG. 1 is a view illustrating a state in which a plurality of semiconductor chips are mounted as a multistage stack in a mounting apparatus.

Hereinafter, a mounting apparatus of a semiconductor chip 100 will be described with reference to the drawings. FIG. 1 is a schematic diagram illustrating a state in which the semiconductor chip 100 is mounted using the mounting apparatus. In FIG. 1, a state in which a plurality of semiconductor chips 100 are stacked, that is, mounted as a multistage stack, is illustrated. However, as will be described below, the technique disclosed in the present application is not limited to the case in which the semiconductor chips 100 are mounted as the multistage stack, but may also be applied to other cases.

In the example of FIG. 1, on a lower surface of each semiconductor chip 100, a bump 102 for electrical connection to an electrode formed on an upper surface of a substrate 110 or on an upper surface of another semiconductor chip 100 (hereinafter, collectively referred to as "mounting surface"), which is disposed at a lower side, is formed. The bump 102 is made of a conductive metal, for example, copper or the like, and reversibly softens and melts at a predetermined melting temperature Tm or higher.

Also, on the lower surface of the semiconductor chip 100, a non-conductive film 104 (hereinafter referred to as "NCF 104") is provided to cover the bump 102. The NCF 104 is made of a thermosetting resin, reversibly softens at a predetermined softening temperature Ts or higher, and irreversibly hardens at a hardening temperature Th or higher, which is higher than the softening temperature.

In the case in which the plurality of semiconductor chips 100 are mounted as a multistage stack, generally, a temporary stacked body is formed by stacking, while temporarily pressure-bonding, a plurality of (four in the illustrated example) semiconductor chips 100 sequentially one by one on the substrate 110, and then, by heating and pressing an upper surface of the temporary stacked body, the plurality of semiconductor chips 100 are finally pressure-bonded collectively. Here, at the time of temporary pressure-bonding, while being pressed hard against the mounting surface, the semiconductor chips 100 are heated to the softening temperature Ts of the NCF 104 or higher, to less than the hardening temperature Th of the NCF 104, or to less than the melting temperature Tm of the bump 102. Consequently, the NCF 104 softens and wraps around, without any gap, between the semiconductor chips 100 and the mounting surface. Also, at this time, by moderately pressing, the bump 102 pushes its way through the NCF 104 and comes into contact with an electrode on the mounting surface. At the time of final pressure-bonding, while the temporary stacked body is pressed, the semiconductor chips 100 are heated to the hardening temperature Th of the NCF 104 or higher and to the melting temperature Tm of the bump 102 or higher. Consequently, the bump 102 is welded to the corresponding electrode, and the NCF 104 hardens.

As illustrated in FIG. 1, a bonding stage 12 and a bonding head 14 are provided in the mounting apparatus that mounts the semiconductor chip 100. The bonding stage 12 is a stage on which the substrate 110 is placed. The bonding stage 12 is set to be movable in the horizontal direction with respect to the bonding head 14. Also, the bonding stage 12 may have a heater (not illustrated) embedded therein or may also heat the substrate 110 as necessary.

By heating the semiconductor chip 100 while pressing the semiconductor chip 100 hard against the mounting surface, the bonding head 14 bonds the semiconductor chip 100 onto the mounting surface. Specifically, the bonding head 14 can suck and hold the semiconductor chip 100 at a distal end portion 18 thereof and is set to be rotatable around a vertical axis and be elevatable and lowerable along the vertical axis. The bonding head 14 has a heater 20 configured to suitably heat the distal end portion 18. The bonding head 14 sucks and holds the semiconductor chip 100 supplied by a chip supply apparatus (not illustrated) and places the semiconductor chip 100 on the mounting surface. Also, the bonding head 14 heats the semiconductor chip 100 placed on the mounting surface while pressing the upper surface of the semiconductor chip 100 hard against the mounting surface.

Here, when the plurality of semiconductor chips 100 are mounted as a multistage stack as described above, after the plurality of semiconductor chips 100 are stacked while being temporarily pressure-bonded sequentially one by one, the obtained stacked body is pressed, while being heated, from an upper surface thereof so that the plurality of semiconductor chips 100 are finally pressure-bonded collectively. At the time of this final pressure-bonding, it is necessary to heat the NCFs 104 of all the semiconductor chips 100 to the hardening temperature Th or higher and heat the bump 102 to the melting temperature Tm or higher. However, because the bonding head 14 only heats the stacked body from the upper surface thereof, among the plurality of semiconductor chips 100, the semiconductor chip 100 at an upper layer is likely to reach a high temperature, and the semiconductor chip 100 at a lower layer is likely to reach a low temperature. That is, in a single stacked body, a temperature gradient occurs in which the closer to the bottom, the lower the temperature. Such a temperature gradient causes a difference in the degree of progress of the hardening of the NCF 104 or the melting of the bump 102 and causes variations between the semiconductor chips 100 in mounting states, which in turn leads to variations in mounting quality.

In the mounting apparatus disclosed in the present application, in order to suppress the occurrence of a temperature gradient between the semiconductor chips 100 or within the semiconductor chip 100, a heating mechanism 16 configured to heat the semiconductor chip 100 from the side is provided. A detailed configuration example of the heating mechanism 16 will be described in detail below, but the configuration thereof is not particularly limited as long as the heating mechanism 16 can heat the semiconductor chip 100 from the side. However, in order not to interfere with the bonding process, it is desired that the heating mechanism 16 be interlocked with the bonding head 14 or be elevatable and lowerable independently of the bonding head 14.

Also, as long as the heating mechanism 16 can heat the semiconductor chip 100, the heating mechanism 16 may be configured to transfer heat of another heat-generating body (for example, the bonding head 14 or the like) to the semiconductor chip 100 or may have a heat-generating body that generates heat by itself. Also, the heating mechanism 16 may be configured to cause the semiconductor chip 100 itself to generate heat by an electromagnetic action or an optical heating action. Also, although it is desired that the heating mechanism 16 heat the entire circumference of the semiconductor chip 100, the heating mechanism 16 may also be configured to heat only a portion of the circumference of the semiconductor chip 100. Accordingly, for example, the heating mechanism 16 may be provided only on the left side of the semiconductor chip 100 and configured to heat the semiconductor chip 100 only from the left side.

In any case, while the final pressure-bonding is performed, by heating the stacked body of the semiconductor chips 100 from the side by the heating mechanism 16, the semiconductor chip 100 which is disposed at a lower layer can also be properly heated. As a result, because the occurrence of temperature gradient within the stacked body can be suppressed, the mounting quality between the plurality of semiconductor chips 100 can be made uniform.

Figure 2:
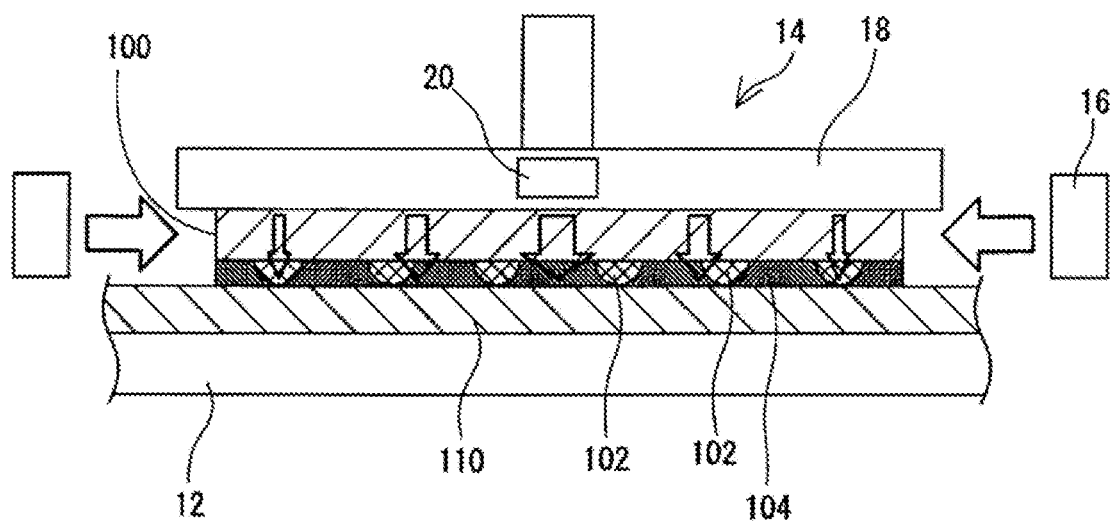
FIG. 2 is a view illustrating a state in which a semiconductor chip is mounted without being stacked in the mounting apparatus.

Further, such a heating mechanism 16 is not limited to being provided in the mounting apparatus that mounts semiconductor chips as a multistage stack and may also be provided in other mounting apparatuses. For example, as illustrated in FIG. 2, the heating mechanism 16 may also be provided in a mounting apparatus that mounts (finally pressure-bonds) the semiconductor chip 100 as a single stage on the substrate 110 without stacking the semiconductor chip 100. Particularly, in the case of a mounting apparatus that handles a semiconductor chip 100 having a relatively large size (for example, 10 mm$^2$ or larger), it is desired that the heating mechanism 16 configured to heat the semiconductor chip 100 from the side be provided.

In the case in which the large-sized semiconductor chip 100 is handled, of course, a distal end portion 18 of a bonding head 14 configured to heat and press the semiconductor chip 100 also has a large size. Temperature variations are likely to occur in such a large-sized distal end portion 18 depending on a location. Particularly, because the vicinity of the periphery of the distal end portion 18 is spaced apart from the heat source (heater 20), and heat dissipation to an external space or the like also occurs at the vicinity of the periphery of the distal end portion 18, the vicinity of the periphery of the distal end portion 18 is more likely to reach a low temperature than the vicinity of the central portion thereof. When the semiconductor chip 100 is heated and pressed using such a distal end portion 18, temperature variations occur depending on a location of the semiconductor chip 100, which in turn causes variations in mounting quality.

Thus, in this case, it is desired that the heating mechanism 16 be provided to heat the semiconductor chip 100 from the side. With such a configuration, because temperature variations within a single semiconductor chip 100 can be reduced, the mounting quality can be stabilized.

Figure 3:
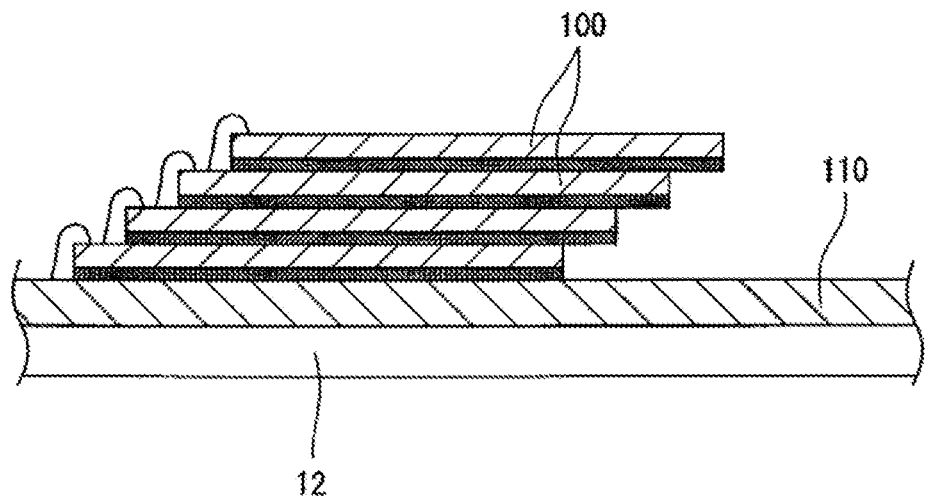
FIG. 3 is a view illustrating a state in which a plurality of semiconductor chips are mounted as a NAND stack in the mounting apparatus.

Also, the heating mechanism 16 may be provided in a mounting apparatus that mounts a plurality of semiconductor chips 100 as a NAND stack. That is, in the NAND stack, as illustrated in FIG. 3, the plurality of semiconductor chips 100 are stacked while shifting their end portions, and electrodes each provided in the vicinity of an end portion of each semiconductor chip 100 are electrically connected by wire bonding. Here, in order to form the NAND stack, the plurality of semiconductor chips 100 are stacked using the bonding head 14. A thermosetting adhesive is provided at a lower surface of the semiconductor chip 100, and, by heating and irreversibly hardening the adhesive, the semiconductor chip 100 is bonded (fixed). While the bonding is performed, the semiconductor chip 100 may not only be heated by a lower heater (not illustrated) provided at a lower portion of the bonding stage 12 but may also be heated from the side as well by the heating mechanism 16.

Figure 4:
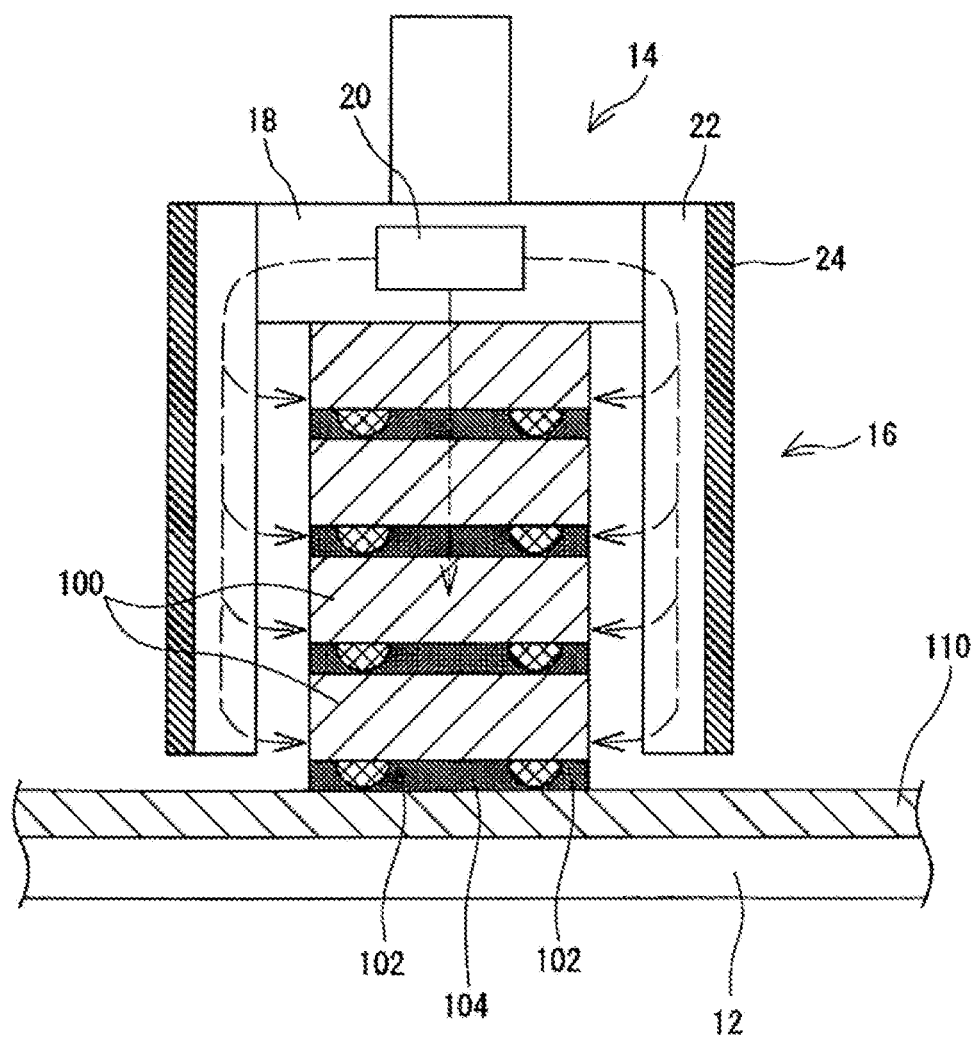
FIG. 4 is a view illustrating an example of a configuration of a heating mechanism.

Next, a configuration example of the heating mechanism 16 will be described. FIG. 4 is a view illustrating an example of the heating mechanism 16. As illustrated in FIG. 4, the heating mechanism 16 may also be a heat transfer body 22 attached to the distal end portion 18 of the bonding head 14 and configured to transfer heat of the distal end portion 18. In this case, the heat transfer body 22 extends downward from the periphery of the distal end portion 18 and is disposed at the side of the semiconductor chip 100 while the bonding is performed. Then, while the bonding is performed, the heat transfer body 22 is heated by heat of the bonding head 14, and the semiconductor chip 100 is heated from the side by the heated heat transfer body 22.

It is desired that the heat transfer body 22 have a cylindrical shape which is substantially concentric with the semiconductor chip 100 so as to cover the entire circumference of the semiconductor chip 100, but it is not necessary for the heat transfer body 22 to have the cylindrical shape. Also, it is desired that a height of the heat transfer body 22 be set according to a height of the semiconductor chip 100 (stacked body). Specifically, while the bonding is performed, it is desired that a lower end of the heat transfer body 22 be disposed in the vicinity of a lower end of the semiconductor chip 100 disposed at the lowermost layer (lower end of the stacked body).

Such a heat transfer body 22 is made of a material with high heat transfer performance, e.g., aluminite or the like. Also, it is desired that, in the heat transfer body 22, at least a surface facing a side surface of the semiconductor chip 100 be subjected to black body treatment. By the black body treatment, radiant heat is generated, and thus the semiconductor chip 100 can be more efficiently heated. Also, in the heat transfer body, an insulating member 24 may be provided at a surface in contact with the outside. With such a configuration, heat dissipation from the bonding head 14 is suppressed, and thus the semiconductor chip 100 can be more efficiently heated.

Figure 5:
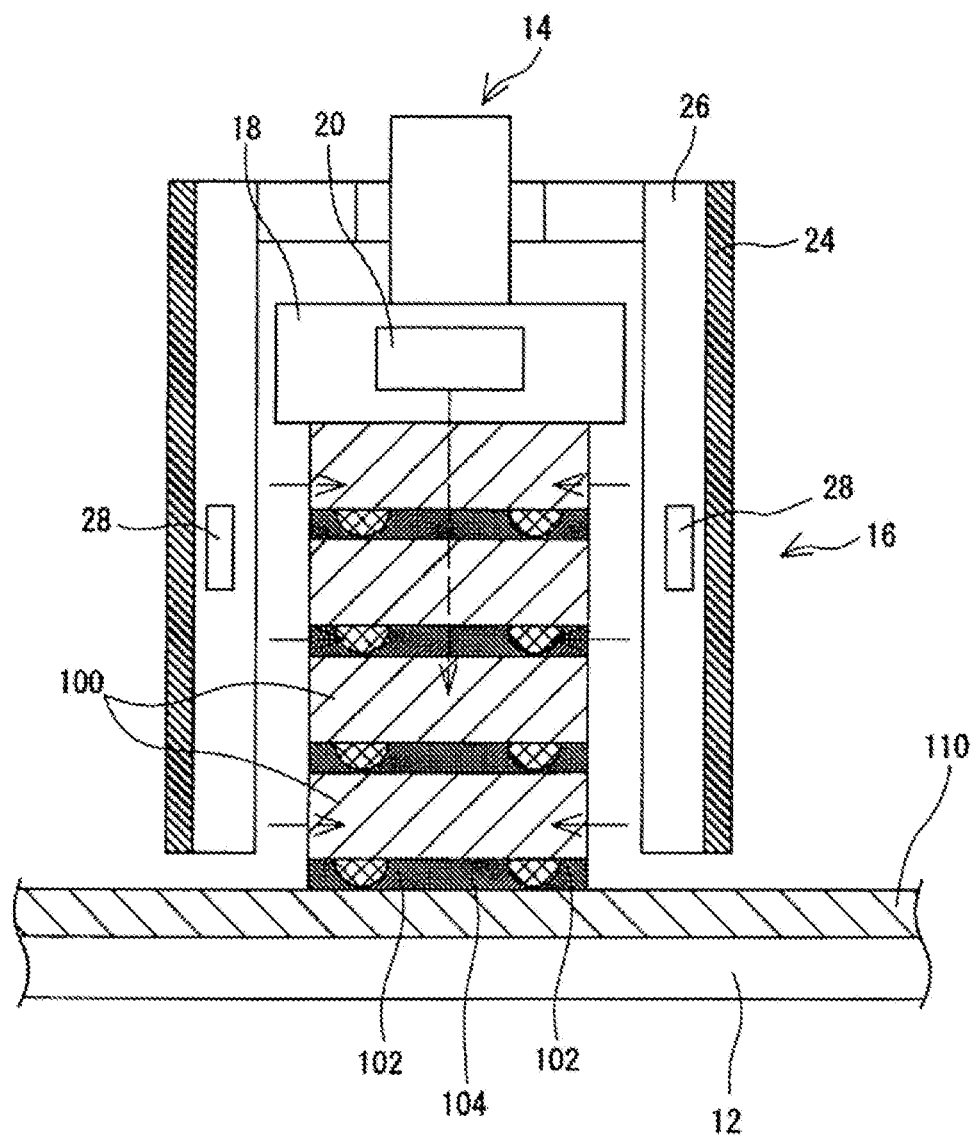
FIG. 5 is a view illustrating another example of the configuration of the heating mechanism.

FIG. 5 is a view illustrating another example of the heating mechanism 16. As illustrated in FIG. 5, the heating mechanism 16 may also be a heating body 26 that has a heater 28, which is a heat source, and is provided as a separate member from the bonding head 14. In this case, the heating body 26 is interlocked with the bonding head 14 or is elevated and lowered independently of the bonding head 14. Also, the shape of the heating body 26 is not particularly limited as long as the heating body 26 is disposed at the side of the semiconductor chip 100 when lowered, but it is desired that the heating body 26 have a substantially cylindrical shape so as to cover the entire circumference of the semiconductor chip 100.

Also, like the above-described heat transfer body 22, it is desired that the heating body 26 be made of a material with high heat transfer performance, e.g., aluminite or the like. Moreover, it is desired that an inner surface of the heating body 26 be subjected to black body treatment, and an outer surface thereof be subjected to insulation treatment.

The heater 28, which is a heat source, is separately provided from the heater 20 of the bonding head 14 and is disposed inside or outside the heating body 26. The heater 28 heats the heating body 26 to a predetermined temperature. Further, in FIG. 5, although the heater 28 is only provided at substantially the center of the heating body 26 in the height direction, in place of or in addition to this position, the heater 28 may be provided at another position. For example, the heater 28 may be provided at each of the vicinity of a lower end of the heating body 26, the center thereof, and the vicinity of an upper end thereof, and a temperature of the heating body 26 may be set to reach a higher temperature gradually closer toward the lower end. That is, because heat applied from the bonding head 14 to the stacked body (semiconductor chip 100) becomes gradually smaller toward the lower layer, in order to offset this heat gradient, heat applied from the heating body 26 to the stacked body may be set to gradually increase toward the lower layer.

Figure 6:
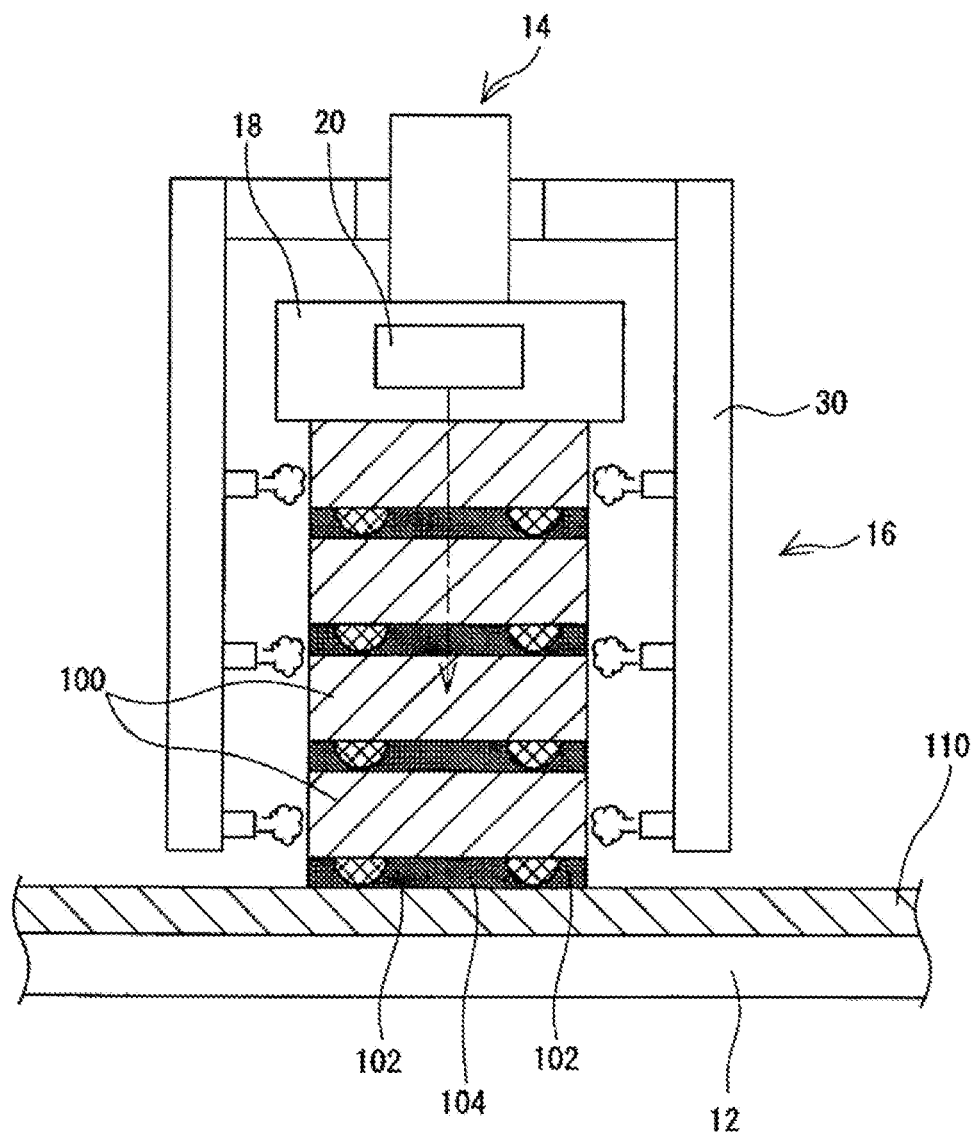
FIG. 6 is a view illustrating another example of the configuration of the heating mechanism.

FIG. 6 is a view illustrating another example of the heating mechanism 16. The heating mechanism 16 may also be configured to heat the semiconductor chip 100 using hot air. That is, as illustrated in FIG. 6, the heating mechanism 16 may have a hot air jetting mechanism 30 configured to jet hot air toward the side of the semiconductor chip 100. The hot air jetting mechanism 30 is not particularly limited as long as it is able to jet a sufficiently-heated gas. For example, the hot air jetting mechanism 30 may include a fan configured to generate a jetting airflow, a motor configured to drive the fan, a heater configured to heat the jetting airflow generated by the fan and form hot air, and a pipe configured to guide the hot air to the side of the semiconductor chip 100. Further, although, in FIG. 6, hot air is mostly jetted in the horizontal direction, the jetting direction thereof is not particularly limited as long as the hot air comes into contact with at least a side surface of the semiconductor chip 100 and may also be obliquely downward or obliquely upward.

Figure 7:
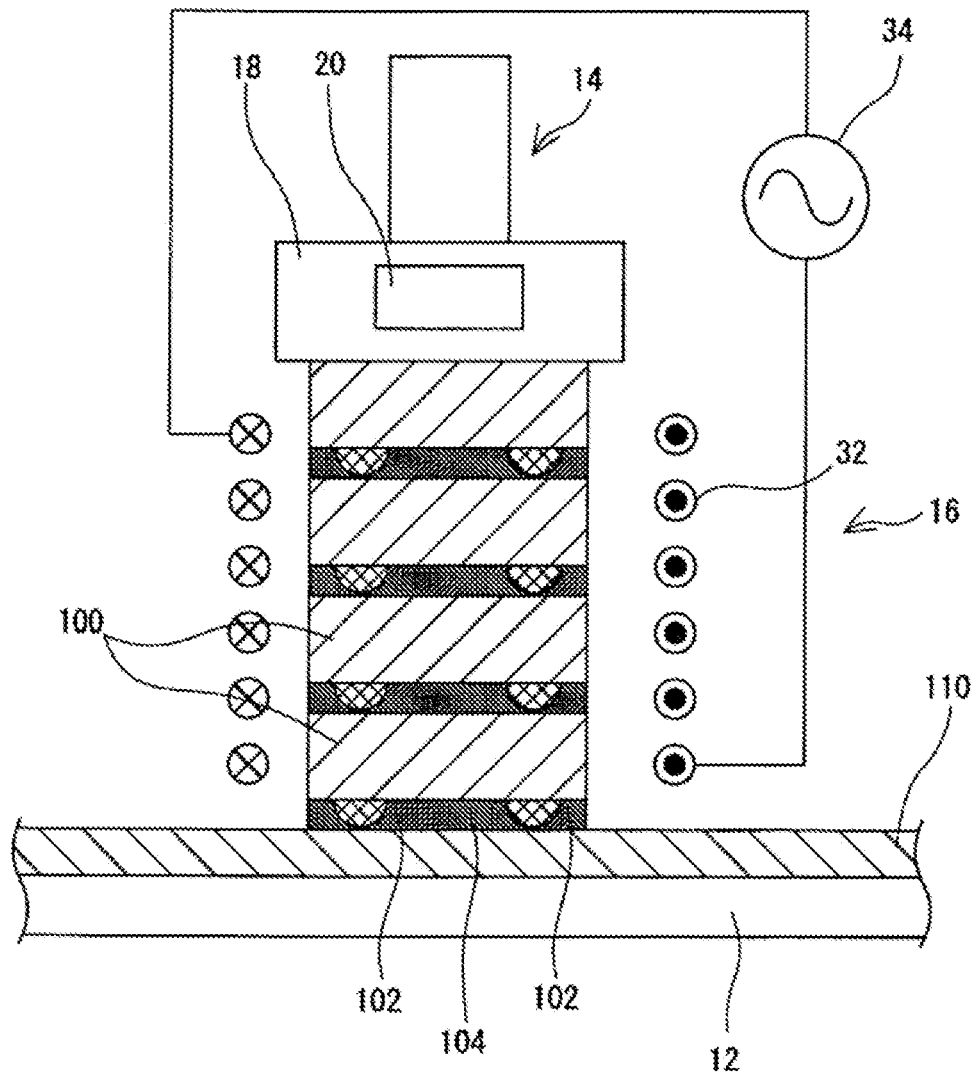
FIG. 7 is a view illustrating another example of the configuration of the heating mechanism.

FIG. 7 is a view illustrating another example of the heating mechanism 16. The heating mechanism 16 may also be configured to cause the semiconductor chip 100 itself to generate heat using an electromagnetic action. That is, as illustrated in FIG. 7, the heating mechanism 16 may have a coil 32 disposed around the semiconductor chip 100 and configured to induction-heat the semiconductor chip 100 as an alternating current is applied. In this case, the coil 32 is spirally wound along the vertical axis. Also, the coil 32 is set to be elevatable and lowerable, and, while the bonding is performed, the coil 32 is lowered to cause the semiconductor chip 100 to be disposed at an inner side of the coil 32. Also, an alternating current power source 34 is connected to the coil 32. While the bonding is performed, the alternating current power source 34 is turned on, and, when an alternating current flows in the coil 32, a current flows to a metal in the semiconductor chip 100 (for example, the bump 102 or the like) due to an electromagnetic action. By Joule heat generated in this case, the semiconductor chip 100 itself generates heat.

Figure 8:
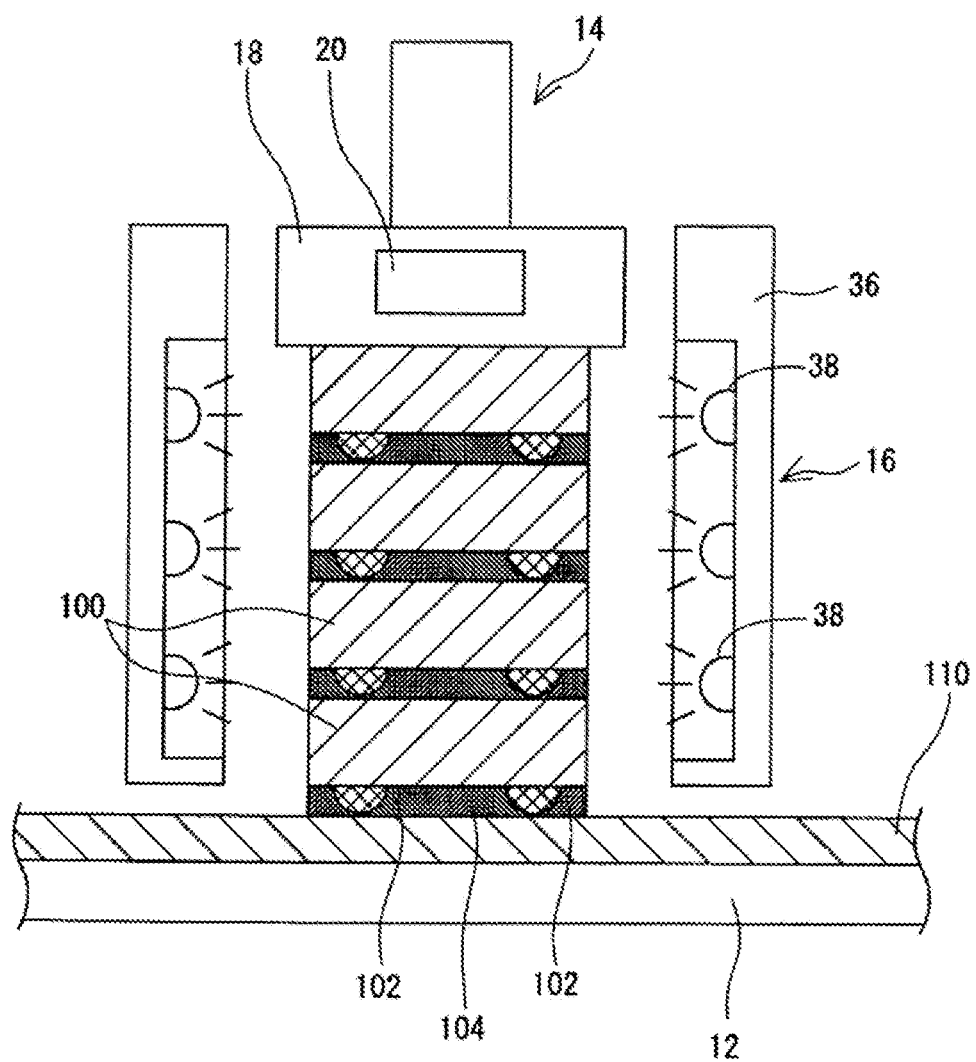
FIG. 8 is a view illustrating another example of the configuration of the heating mechanism.

FIG. 8 is a view illustrating another example of the heating mechanism 16. The heating mechanism 16 may be configured to heat the semiconductor chip 100 by optical heating. That is, as illustrated in FIG. 8, the heating mechanism 16 may include, at the side of the semiconductor chip 100, a lamp annealing mechanism 36 configured to perform optical heating by irradiating light. The lamp annealing mechanism 36 has a light source 38 configured to irradiate light. A halogen lamp, a xenon lamp, an infrared lamp, or the like may be used as the light source 38. Also, the light source 38 may be continuously turned on or may be a flash type that is momentarily turned on. As illustrated in FIG. 8, the light source 38 may be disposed at the side of the semiconductor chip 100 so as to allow light from the light source 38 to directly come into contact with a side surface of the semiconductor chip 100. Also, as another form, the light source 38 may be disposed at a location spaced apart from the semiconductor chip 100, and light from the light source 38 may be guided to the side surface of the semiconductor chip 100 using various optical members (a lens, a reflective mirror, or the like). In any case, high-energy light irradiated from the light source 38 comes into contact with the side surface of the semiconductor chip 100 such that the side surface of the semiconductor chip 100 is heated.

Further, all of the above-described configurations are merely examples, and, as long as the mounting apparatus has the heating mechanism 16 configured to heat a semiconductor chip 100 from the side when the semiconductor chip 100 is bonded using the bonding head 14, other configurations of the mounting apparatus may be appropriately changed. For example, although the number of bonding heads 14 has been described above as one, the number of bonding heads 14 may also be plural. Accordingly, for example, two types of bonding heads 14, a bonding head 14 for temporary pressure-bonding and a bonding head 14 for final pressure-bonding, may be provided. Also, although the bonding head 14 has been described above as only coming into contact with an upper surface of a single semiconductor chip 100, the bonding head 14 may also be configured to simultaneously heat and press two or more semiconductor chips arranged adjacent to each other in a surface direction. In this case, it is desired that the heating mechanism 16 heat each of the two or more semiconductor chips, which are simultaneously heated and pressed, from the side. Also, although the examples of the heating mechanism 16 have been described above with reference to FIGS. 4 to 8, the heating mechanism 16 may have any other configuration as long as it is able to heat the semiconductor chip 100 from the side.

What is claimed is:

1. A mounting apparatus of a semiconductor chip, the mounting apparatus comprising:
    a bonding head configured to perform a bonding to, while pressing, a semiconductor chip onto a substrate or another semiconductor chip; and
    a heating mechanism configured to perform, while the bonding is performed, a heating to the semiconductor chip from the side,
    wherein the heating mechanism is elevated and lowered independently of the bonding head, is disposed at a side of the semiconductor chip while the bonding is performed.

2. The mounting apparatus according to claim 1, wherein the heating mechanism heats the semiconductor chip from the entire circumference thereof.

3. The mounting apparatus according to claim 1, wherein:
    by stacking, while temporarily pressure-bonding, two or more semiconductor chips and then heating and pressing an upper surface of the obtained stacked body, the bonding head performs a final pressure-bonding to the two or more semiconductor chips collectively; and
    at the time of the final pressure-bonding, the heating mechanism heats the stacked body from the side.

4. The mounting apparatus according to claim 2, wherein:
    by stacking, while temporarily pressure-bonding, two or more semiconductor chips and then heating and pressing an upper surface of the obtained stacked body, the bonding head performs a final pressure-bonding to the two or more semiconductor chips collectively; and
    at the time of the final pressure-bonding, the heating mechanism heats the stacked body from the side.

5. The mounting apparatus of claim 1, wherein the heating mechanism comprises a heat transfer body, the heat transfer body is attached to a distal end portion of the bonding head to transfer heat of the bonding head, and the heat transfer body is extending downward from the vicinity of the periphery of the distal end portion.

6. The mounting apparatus of claim 1, wherein the heating mechanism comprises a heating body.

7. The mounting apparatus of claim 1, wherein the heating mechanism comprises a hot air jetting mechanism configured to jet hot air to the side of the semiconductor chip.

8. The mounting apparatus of claim 1, wherein the heating mechanism comprises a coil disposed around the semiconductor chip and configured to induction-heat the semiconductor chip as an alternating current is applied.

9. The mounting apparatus of claim 1, wherein the heating mechanism comprises a lamp annealing mechanism configured to perform optical heating by irradiating light at a side of the semiconductor chip.

10. A semiconductor chip mounting method, comprising:
    heating a semiconductor chip from a side as well by a heating mechanism, when the semiconductor chip is pressed from an upper surface thereof by a bonding head, and the semiconductor chip is bonded onto a substrate or another semiconductor chip,
    wherein the heating mechanism is elevated and lowered independently of the bonding head, is disposed at a side of the semiconductor chip while the bonding is performed.

11. The mounting apparatus of claim 2, wherein the heating mechanism comprises a heat transfer body, the heat transfer body is attached to a distal end portion of the bonding head to transfer heat of the bonding head, and the heat transfer body is extending downward from the vicinity of the periphery of the distal end portion.

12. The mounting apparatus of claim 3, wherein the heating mechanism comprises a heat transfer body, the heat transfer body is attached to a distal end portion of the bonding head to transfer heat of the bonding head, and the heat transfer body is extending downward from the vicinity of the periphery of the distal end portion.

13. The mounting apparatus of claim 2, wherein the heating mechanism comprises a heating body heated by a heat source.

14. The mounting apparatus of claim 3, wherein the heating mechanism comprises a heating body heated by a heat source.

15. The mounting apparatus of claim 2, wherein the heating mechanism comprises a hot air jetting mechanism configured to jet hot air to the side of the semiconductor chip.

16. The mounting apparatus of claim 3, wherein the heating mechanism comprises a hot air jetting mechanism configured to jet hot air to the side of the semiconductor chip.

17. The mounting apparatus of claim 2, wherein the heating mechanism comprises a coil disposed around the semiconductor chip and configured to induction-heat the semiconductor chip as an alternating current is applied.

18. The mounting apparatus of claim 3, wherein the heating mechanism comprises a coil disposed around the semiconductor chip and configured to induction-heat the semiconductor chip as an alternating current is applied.

19. The mounting apparatus of claim 2, wherein the heating mechanism comprises a lamp annealing mechanism configured to perform optical heating by irradiating light at a side of the semiconductor chip.

20. The mounting apparatus of claim 3, wherein the heating mechanism comprises a lamp annealing mechanism configured to perform optical heating by irradiating light at a side of the semiconductor chip.

* * * * *